(12) United States Patent
Nishikawa et al.

(10) Patent No.: US 11,404,899 B2
(45) Date of Patent: Aug. 2, 2022

(54) BATTERY SYSTEM AND BATTERY MANAGEMENT DEVICE FOR CANCELLING POLARIZATION VOLTAGE BY APPLYING A REVERSE CURRENT

(71) Applicant: Panasonic Intellectual Property Management Co., Ltd., Osaka (JP)

(72) Inventors: Shinya Nishikawa, Osaka (JP); Tohru Watanabe, Gifu (JP); Takashi Iida, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 31 days.

(21) Appl. No.: 17/253,676

(22) PCT Filed: Feb. 13, 2019

(86) PCT No.: PCT/JP2019/005065
§ 371 (c)(1),
(2) Date: Dec. 18, 2020

(87) PCT Pub. No.: WO2020/003582
PCT Pub. Date: Jan. 2, 2020

(65) Prior Publication Data
US 2021/0265856 A1    Aug. 26, 2021

(30) Foreign Application Priority Data
Jun. 27, 2018    (JP) .............................. JP2018-122029

(51) Int. Cl.
*H02J 7/34*    (2006.01)
*G01R 31/396*    (2019.01)
(Continued)

(52) U.S. Cl.
CPC .......... *H02J 7/345* (2013.01); *G01R 31/3835* (2019.01); *G01R 31/396* (2019.01);
(Continued)

(58) Field of Classification Search
CPC ........ H02J 7/345; H02J 7/0048; H02J 7/0013; H02J 7/0047; H02J 7/005; H02J 7/0069;
(Continued)

(56) References Cited

U.S. PATENT DOCUMENTS

2010/0164430 A1* 7/2010 Lu .......................... H02J 7/0016
320/152
2016/0272080 A1* 9/2016 Chang ..................... B60L 58/12
(Continued)

FOREIGN PATENT DOCUMENTS

| JP | 2009-073266 | 4/2009 |
| JP | 2015-105874 | 6/2015 |
| JP | 2017-138128 | 8/2017 |

OTHER PUBLICATIONS

International Search Report of PCT application No. PCT/JP2019/005065 dated Mar. 26, 2019.

*Primary Examiner* — Nathaniel R Pelton
(74) *Attorney, Agent, or Firm* — McDermott Will & Emery LLP

(57) ABSTRACT

A voltage measurer measures a voltage of a battery cell. A controller controls charging-discharging of the battery cell. The controller performs control to apply a reverse current for canceling a polarization voltage of the battery cell through the battery cell after the completion of charging-discharging of the battery cell. For example, after the charging-discharging of the battery cell completes, the controller sets a current command value, in a power converter, that instructs flow of a reverse current of a preset value for a preset time.

5 Claims, 5 Drawing Sheets

(51) Int. Cl.
*G01R 31/3835* (2019.01)
*H02J 7/00* (2006.01)
*H01M 10/42* (2006.01)
*H01M 10/44* (2006.01)
*H01M 10/48* (2006.01)

(52) U.S. Cl.
CPC ......... *H01M 10/425* (2013.01); *H01M 10/44* (2013.01); *H01M 10/48* (2013.01); *H02J 7/0013* (2013.01); *H02J 7/0048* (2020.01); H01M 2010/4271 (2013.01)

(58) Field of Classification Search
CPC ............. G01R 31/396; G01R 31/3835; G01R 31/392; G01R 31/387; G01R 31/385; H01M 10/425; H01M 10/44; H01M 10/48; H01M 2010/4271
USPC ........................................................ 320/134
See application file for complete search history.

(56) References Cited

U.S. PATENT DOCUMENTS

2016/0276843 A1* 9/2016 Chang .................... B60L 58/24
2019/0064276 A1 2/2019 Kawai et al.

* cited by examiner

BATTERY SYSTEM AND BATTERY MANAGEMENT DEVICE FOR CANCELLING POLARIZATION VOLTAGE BY APPLYING A REVERSE CURRENT

CROSS-REFERENCE TO RELATED APPLICATIONS

This application is a U.S. national stage application of the PCT International Application No. PCT/JP2019/005065 filed on Feb. 13, 2019, which claims the benefit of foreign priority of Japanese patent application No. 2018-122029, filed on Jun. 27, 2018, the contents all of which are incorporated herein by reference.

TECHNICAL FIELD

The present invention relates to a battery system including a battery cell such as a lithium ion battery, and a battery management device.

BACKGROUND ART

For secondary batteries such as lithium ion batteries, it is required to accurately estimate SOC (State Of Charge). In particular, it is important that secondary batteries installed in electric vehicles such as hybrid vehicles (HVs), plug-in hybrid vehicles (PHVs), and electric vehicles (EVs) accurately estimate the SOC in order to correctly grasp the cruising range. The SOC is generally uniquely associated with OCV (Open Circuit Voltage).

A secondary battery is an electrochemical product, and when a charging current flows through the secondary battery, the measured voltage rises non-linearly, and when a discharge current flows through the secondary battery, the measured voltage drops non-linearly. The voltage measured when a current is flowing through the secondary battery is called CCV (Closed Circuit Voltage) or operating voltage. In a general lithium ion battery cell, the measured voltage converges to the vicinity of OCV that does not contain an overvoltage component about 30 seconds after the completion of charging-discharging. Therefore, the accuracy of OCV is maintained even if the measured voltage 30 seconds after the completion of charging-discharging is treated as OCV.

In recent years, lithium ion battery cells using a negative electrode material mixed with silicon have been developed. In the lithium-ion battery cell, the polarization elimination time is longer than that of a general cell, and it takes 1 hour to 10 hours or more to converge to OCV after the completion of charging-discharging. Further, even in a general battery cell, the time for convergence to OCV becomes longer than usual at a low temperature or in a state where degradation has progressed.

There is a method of estimating the polarization characteristics by expressing the secondary battery with an equivalent circuit model. For example, a method has been proposed in which various parameters of the equivalent circuit of a secondary battery are estimated such that data after the charge/discharge current is switched and stabilized (for example, four minutes later) is measured and the measured data is applied to an optimization algorithm or the like (see, for example, PTL 1). Further, a method of sequentially estimating various parameters of the equivalent circuit of the secondary battery using a Kalman filter has also been proposed (see, for example, PTL 2).

CITATION LIST

Patent Literature

PTL 1: Unexamined Japanese Patent Publication No. 2015-105874
PTL 2: Unexamined Japanese Patent Publication No. 2017-138128

SUMMARY OF THE INVENTION

As described above, when the time from the completion of charge-discharge to the convergence to OCV becomes long, the state in which the measured voltage deviates from OCV continues for a long time. During that period, the SOC estimation accuracy also decreases. Further, even if the method of estimating the polarization characteristics by expressing the secondary battery with an equivalent circuit model is used, the accuracy of an initial value will decrease unless the voltage after a long time has passed since the completion of charging-discharging is used, and when the accuracy of the initial value is low, the SOC estimation accuracy will also decrease.

The present invention has been made in view of such a situation, and an object of the present invention is to provide a technique for making a highly accurate OCV estimable at an early stage after the completion of charging-discharging of a secondary battery.

In order to solve the above problem, a battery system according to an aspect of the present invention includes a battery cell, a voltage measurer that measures a voltage of the battery cell, and a controller that controls charging-discharging of the battery cell. The controller performs control to apply a reverse current for canceling the polarization voltage of the battery cell through the battery cell after the completion of charging-discharging of the battery cell.

According to the present invention, a highly accurate OCV can be estimated at an early stage after the completion of charging-discharging of the secondary battery.

DESCRIPTION OF EMBODIMENT

Figure 1:
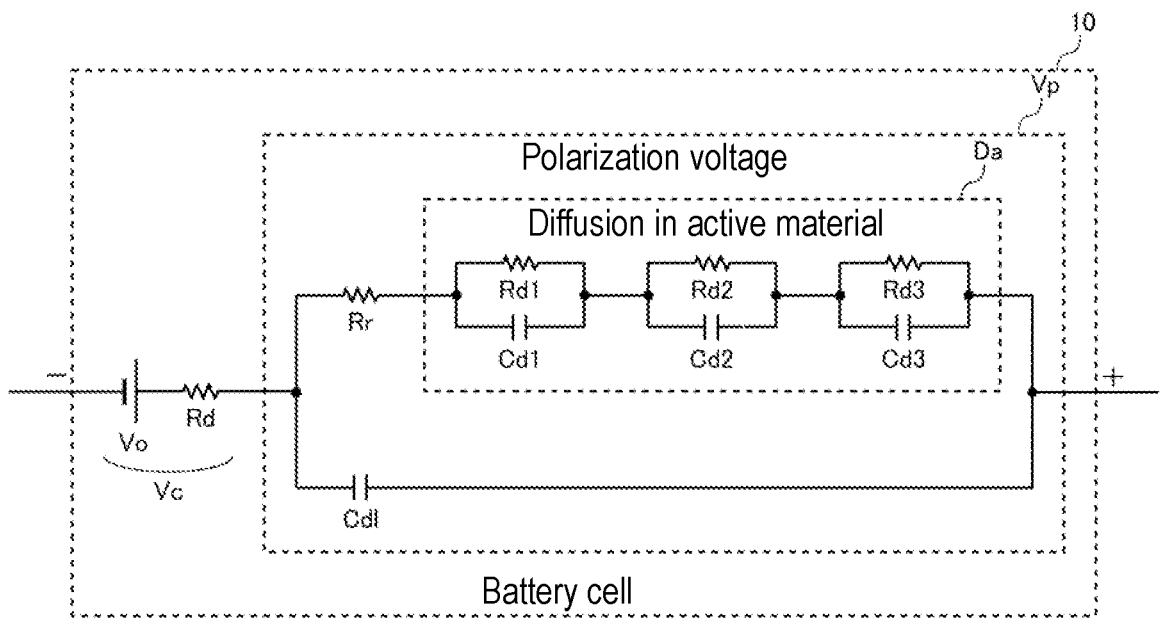
FIG. 1 is a diagram showing an example of an equivalent circuit model of a battery cell.

FIG. 1 is a diagram showing an example of an equivalent circuit model of battery cell 10. FIG. 1 shows an equivalent circuit model of a lithium ion secondary battery as the equivalent circuit model of battery cell 10. Open circuit voltage Vo (=OCV) indicates a DC voltage source that represents the electromotive force. DC resistor Rd indicates a resistance component when a current flows through a solution or an electrode. The polarization voltage indicates the difference between total voltage Vc of open circuit voltage Vo and a voltage applied to DC resistor Rd and the measured voltage between both ends of battery cell 10.

The electrode reaction goes through the processes of charging an electric double layer, a charge transfer reaction, and diffusion in an active material. Electric double layer capacitance Cdl in FIG. 1 is a capacitance component indicating charge accumulation due to the charging current of the electric double layer. Reaction resistor Rr indicates a resistance component based on the charge transfer reaction. Diffusion resistors Rd1 to Rd3 indicate resistance components based on the diffusion of lithium ions in an active material, and diffusion capacitances Cd1 to Cd3 indicate capacitance components based on the diffusion of lithium ions in an active material.

Figure 2:
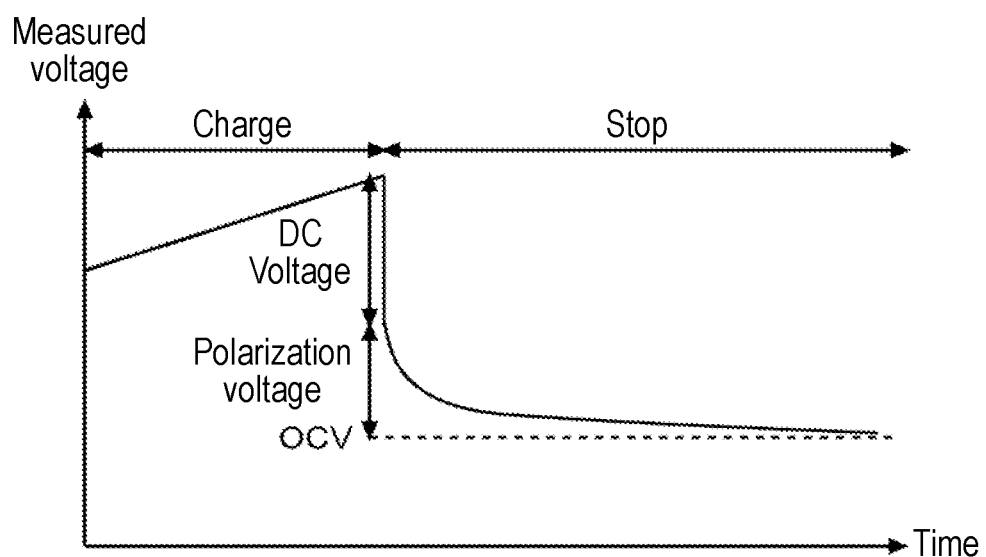
FIG. 2 is a diagram showing the behavior of a measured voltage when charging of the battery cell shown in FIG. 1 is stopped.

FIG. 2 is a diagram showing the behavior of a measured voltage when charging of battery cell 10 shown in FIG. 1 is stopped. When battery cell 10 is charged at a constant current rate, the measured voltage of battery cell 10 gradually increases. When charging is stopped, the increase in DC voltage based on DC resistor Rd and charging current shown in FIG. 1 disappears, and the measured voltage decreases for the increase in DC voltage. Then, the polarization voltage gradually decreases, and the measured voltage converges to OCV.

Note that in the case of discharge, the opposite is true, such that when charging is stopped, the reduction in DC voltage based on DC resistor Rd and discharge current shown in FIG. 1 disappears, and the measured voltage increases for the reduction in DC voltage. Then, the polarization voltage gradually increases, and the measured voltage converges to OCV.

Figure 3:
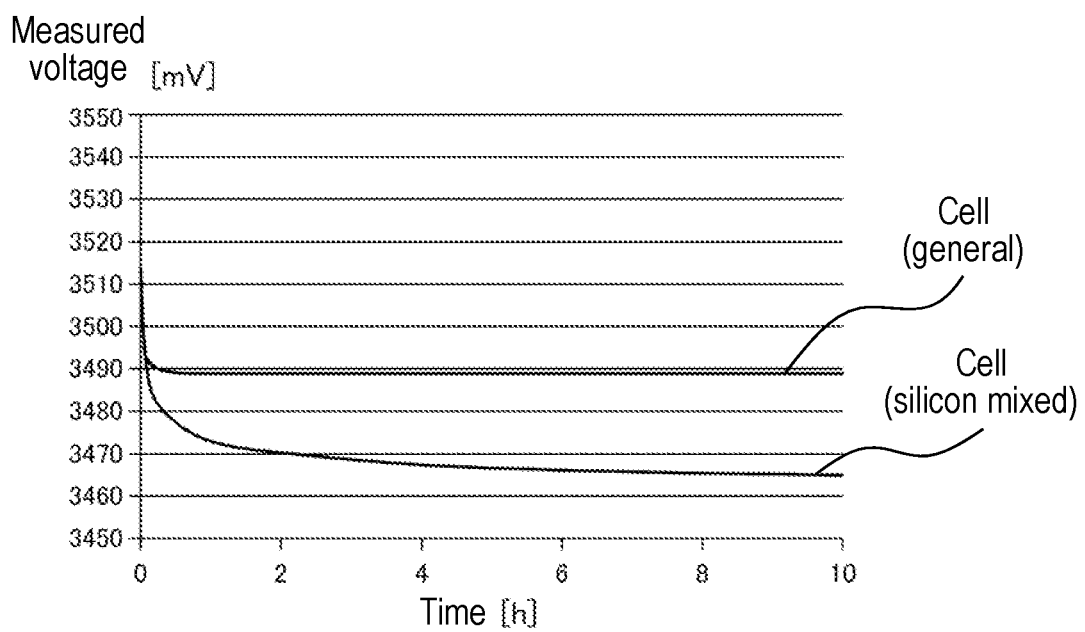
FIG. 3 is a diagram of a comparison between the measured voltage of a battery cell that converges relatively quickly to OCV and the measured voltage of a battery cell that converges relatively slowly to OCV after charging is stopped.

FIG. 3 is a diagram of a comparison between the measured voltage of a battery cell that converges relatively quickly to OCV and the measured voltage of a battery cell that converges relatively slowly to OCV after charging is stopped. The measured voltage of a battery cell using a general graphite negative electrode converges to OCV about 30 seconds after the charging is stopped. On the other hand, the measured voltage of the battery cell using a negative electrode mixed with silicon converges to OCV about 10 hours after the charging is stopped. Therefore, in a battery cell using a negative electrode mixed with silicon, the OCV estimation accuracy decreases for about 10 hours after the charging is stopped. Based on the OCV whose accuracy has decreased, the accuracy of the SOC estimated by referring to a SOC-OCV curve also decreases.

The relaxation of polarization is due to the self-discharge of electric double layer capacitance Cdl and diffusion capacitances Cd1 to Cd3 shown in FIG. 1. When the charges in electric double layer capacitance Cdl and diffusion capacitances Cd1 to Cd3 are removed, the polarization is eliminated and the measured voltage converges to OCV. Therefore, in the present exemplary embodiment, after charging-discharging is stopped, a current (reverse current) that cancels polarization voltage Vp according to the polarity of polarization voltage Vp of battery cell 10 is applied, and the charges accumulated in electric double layer capacitance Cdl and diffusion capacitances Cd1 to Cd3 are removed. That is, when the polarity of polarization voltage Vp of battery cell 10 is in the charging polarity state for charging battery cell 10, a discharge current is applied for a certain period after the charging is stopped, and when the polarity of polarization voltage Vp of battery cell 10 is in the discharging polarity state for discharging battery cell 10, a charging current is applied for a certain period after the discharging is stopped. The reverse current after the charge and discharge stop cancels the charges accumulated in electric double layer capacitance Cdl and diffusion capacitances Cd1 to Cd3, and the polarization is eliminated at an early stage.

Figure 4:
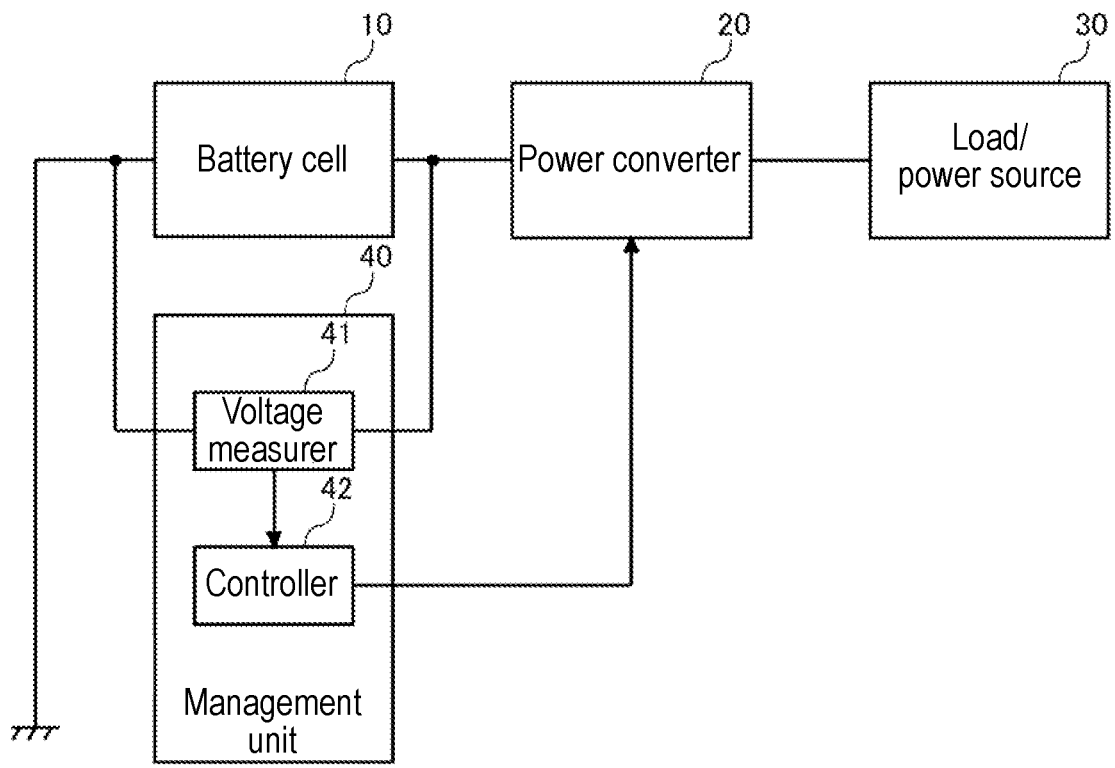
FIG. 4 is a diagram showing a basic circuit diagram for explaining charging-discharging of a battery cell according to an exemplary embodiment of the present invention.

FIG. 4 shows a basic circuit diagram for explaining charging-discharging of battery cell 10 according to an exemplary embodiment of the present invention. Battery cell 10 is connected to load/power source 30 via power converter 20. Power converter 20 is, for example, a bidirectional inverter or a bidirectional DC/DC converter. Load/power source 30 is, for example, an AC load, a DC load, an AC power source, or a DC power source.

For example, the bidirectional inverter as power converter 20 converts a DC power discharged from battery cell 10 into AC power, and supplies the converted AC power to the AC load. Further, the bidirectional inverter converts AC power supplied from an AC power source (for example, a commercial power system or an AC generator) into DC power, and charges the converted DC power into battery cell 10.

For example, the bidirectional DC/DC converter as power converter 20 converts the DC power discharged from battery cell 10 into DC power of another voltage, and supplies the converted DC power into a DC load (including another storage battery and capacitor). Further, the bidirectional DC/DC converter converts DC power supplied from a DC power source (for example, another storage battery, capacitor, solar cell, or a DC generator) into DC power of another voltage, and charges the converted DC power into battery cell 10.

Management unit 40 is a device that manages the state and charging-discharging of battery cell 10. Management unit 40 includes voltage measurer 41 and controller 42. Voltage measurer 41 measures the voltage across battery cell 10 and outputs it to controller 42. Controller 42 controls charging-discharging of battery cell 10. Specifically, controller 42 sets a current command value or a voltage command value in power converter 20 to execute constant current charging (CC charging), constant voltage charging (CV charging), constant current discharging (CC discharging), or constant voltage discharging (CV discharging) of battery cell 10.

Power converter 20 includes a switching element, and by controlling the duty ratio of the switching element based on the current command value or the voltage command value set from controller 42, the charging current, the charging voltage, the discharging current, or the discharging voltage is controlled.

After the charging-discharging of battery cell 10 completes, controller 42 sets, in power converter 20, a current command value instructing the flow of a reverse current that generates a voltage of a polarity opposite to the polarity of polarization voltage Vp of a preset value according to the polarity of polarization voltage Vp of battery cell 10 for a preset time. After the charging of battery cell 10 completes, controller 42 sets a current command value, in power converter 20, that instructs the flow of a discharge current of a preset value for a preset time. After the discharging of battery cell 10 completes, controller 42 sets a current command value, in power converter 20, that instructs the flow of a charging current of a preset value for a preset time.

The value and the flow time of the reverse current for canceling the polarization voltage applied after the completion of charging-discharging of battery cell 10 are determined in advance based on experiments and simulations. For example, the value and the flow time of the reverse current (discharge current) may be determined for each category of the measured voltage of battery cell 10 after charging completes based on experiments or simulations. Further, the value and the flow time of the reverse current (discharge current) may be determined for each category of the measured temperature of battery cell 10. Further, the value and the flow time of the reverse current (discharge current) may be determined for each category of SOH (State of Health) of battery cell 10. Further, the value and the flow time of the reverse current (discharge current) may be determined for a combination of any two or a combination of three parameters of the measured voltage, the measured temperature, and the SOH. Similarly, the value and the flow time of the reverse current (charging current) may be determined for each category of the measured voltage of battery cell 10 after discharging completes based on experiments or simulations. Further, the value and the flow time of the reverse current (charging current) may be determined for each category of the measured temperature of battery cell 10. Further, the value and the flow time of the reverse current (charging current) may be determined for each category of the SOH of battery cell 10. Further, the value and the flow time of the reverse current (charging current) may be determined for a combination of any two or a combination of three parameters of the measured voltage, the measured temperature, and the SOH. These pieces of data are mapped and registered in advance in controller 42. Controller 42 determines the value and the flow time of the reverse current based on the voltage of battery cell 10 measured by voltage measurer 41 at the completion of charging-discharging with reference to the map.

Figure 5:
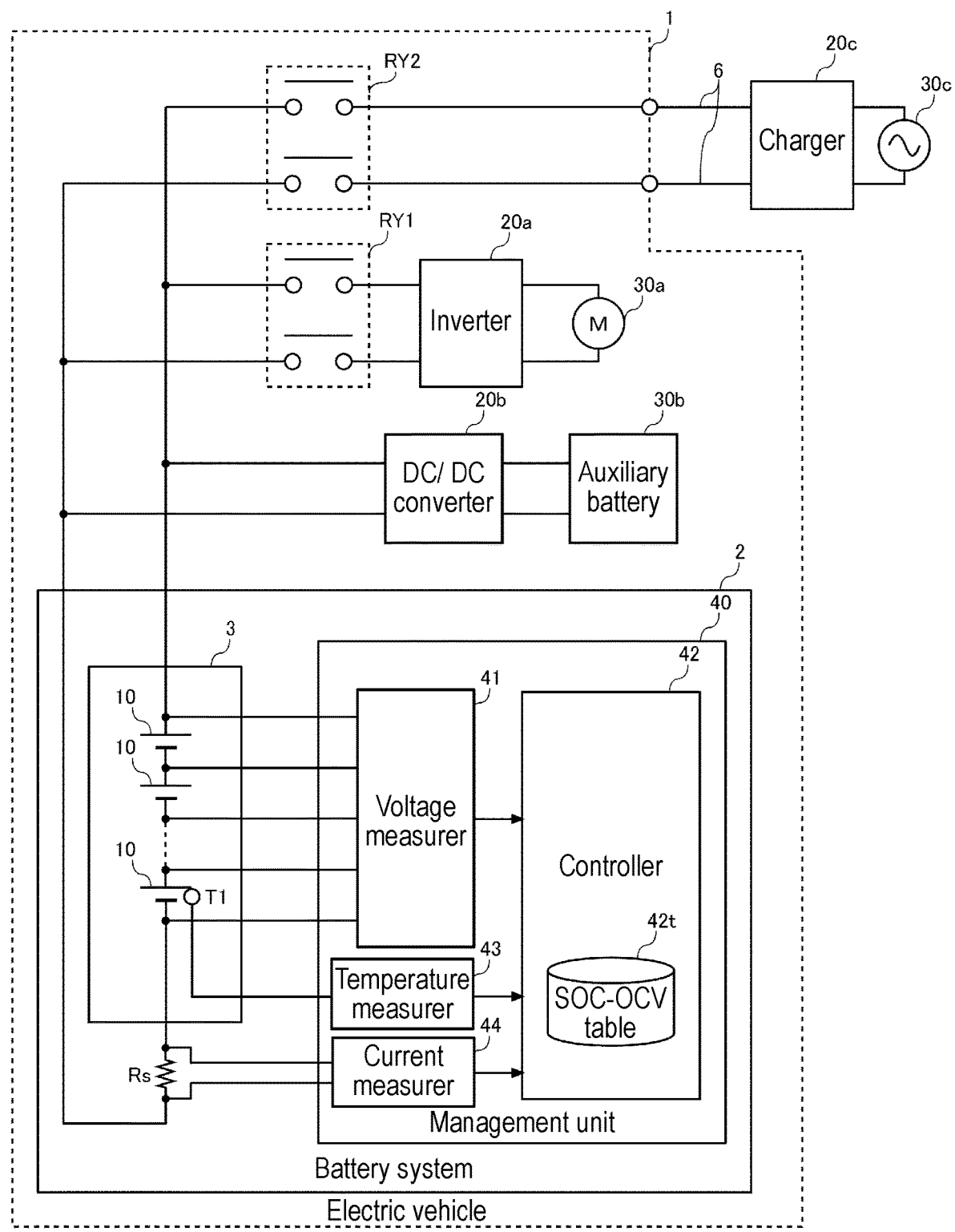
FIG. 5 is a diagram for explaining an electric vehicle equipped with a battery system according to the exemplary embodiment of the present invention.

FIG. 5 is a diagram for explaining electric vehicle 1 equipped with battery system 2 according to the exemplary embodiment of the present invention. Electric vehicle 1 is assumed to be an EV/PHV that can be charged from charger 20*c* installed outside.

Battery system 2 is connected to motor 30*a* via first relay RY1 and inverter 20*a*. Inverter 20*a* converts the DC power supplied from battery system 2 into AC power and supplies it to motor 30*a* at the time of power running. At the time of regeneration, the AC power supplied from motor 30*a* is converted into DC power, which is supplied to battery system 2. Motor 30*a* is a three-phase AC motor, and rotates according to the AC power supplied from inverter 20*a* at the time of power running. At the time of regeneration, the rotational energy due to deceleration is converted into AC power, which is supplied to inverter 20*a*.

First relay RY1 is inserted between wirings connecting battery module 3 and inverter 20*a*. Management unit 40 of battery system 2 controls first relay RY1 to be in the on state (closed state) during traveling, and electrically connects battery system 2 and the power system of electric vehicle 1. In principle, management unit 40 controls first relay RY1 to be in the off state (open state) when the vehicle is not traveling, and electrically shuts off battery system 2 and the power system of electric vehicle 1. Note that, instead of the relay, another type of switch such as a semiconductor switch may be used.

Battery system 2 can be charged from commercial power system 30*c* by connecting to charger 20*c* installed outside electric vehicle 1 with charging cable 6. Charger 20*c* will be installed in homes, car dealers, service areas, commercial facilities, public facilities, and the like. Charger 20*c* is connected to commercial power system 30*c* and charges battery system 2 in electric vehicle 1 via charging cable 6. In the vehicle, second relay RY2 is inserted between wirings connecting battery system 2 and charger 20*c*. Note that, instead of the relay, another type of switch such as a semiconductor switch may be used. Management unit 40 of battery system 2 controls second relay RY2 to be in the on state (closed state) before the start of charging, and controls second relay RY2 to be in the off state (open state) after the charging completes.

Generally, the system is charged with AC in the case of normal charging and with DC in the case of rapid charging. In the case of charging with AC, AC power is converted to DC power by an AC/DC converter (not shown) inserted between second relay RY2 and battery system 2.

Auxiliary battery 30*b* is connected to a current path connecting battery system 2 and inverter 20*a* via DC/DC converter 20*b*. Auxiliary battery 30*b* usually includes a 12 V output lead battery. DC/DC converter 20*b* can boost the DC power discharged from auxiliary battery 30*b* to a voltage equal to or higher than the voltage of the current path, and supply the boosted DC power to the current path. Further, DC/DC converter 20*b* can step down the voltage of the DC power in the current path to a voltage of auxiliary battery 30*b* and supply the stepped-down DC power to auxiliary battery 30*b*.

Battery module 3 includes a plurality of battery cells 10. Hereinafter, an example in which the lithium ion battery cell (nominal voltage: 3.6 to 3.7 V) shown in FIG. 1 is used as battery cell 10 is assumed. A number of series connections of battery cells 10 is determined according to the drive voltage of motor 30*a*.

Shunt resistor Rs is connected in series with the plurality of battery cells 10. Shunt resistor Rs functions as a current detection element. A Hall element may be used instead of shunt resistor Rs. Further, temperature sensor T1 for detecting the temperatures of the plurality of battery cells 10 is installed. For temperature sensor T1, for example, a thermistor can be used.

Management unit 40 includes voltage measurer 41, controller 42, temperature measurer 43, and current measurer 44. Voltage measurer 41 and each node of the plurality of battery cells 10 connected in series are connected by a plurality of voltage lines. Voltage measurer 41 measures the voltage of each battery cell 10 by measuring the voltage between two adjacent voltage lines. Voltage measurer 41 transmits the measured voltage of each battery cell 10 to controller 42.

Since voltage measurer 41 has a higher voltage than controller 42, voltage measurer 41 and controller 42 are connected by a communication line in an insulated state. Voltage measurer 41 can include a general-purpose analog front-end integrated circuit (IC) or an application specific integrated circuit (ASIC). Voltage measurer 41 includes a multiplexer and an A/D converter. The multiplexer outputs the voltage between two adjacent voltage lines to the A/D converter in order from the top. The A/D converter converts the analog voltage input from the multiplexer into a digital value.

Temperature measurer 43 includes a voltage dividing resistor and an A/D converter. The A/D converter converts the voltage divided by temperature sensor T1 and the voltage dividing resistor into a digital value and outputs it to controller 42. Controller 42 estimates the temperatures of the plurality of battery cells 10 based on the digital value.

Current measurer 44 includes a differential amplifier and an A/D converter. The differential amplifier amplifies the voltage across shunt resistor Rs and outputs it to the A/D converter. The A/D converter converts the voltage input from the differential amplifier into a digital value and outputs it to controller 42. Controller 42 estimates the current flowing through the plurality of battery cells 10 based on the digital value.

When an A/D converter is mounted in controller 42 and an analog input port is installed in controller 42, temperature measurer 43 and current measurer 44 may output an analog voltage to controller 42 and the analog voltage may be converted into a digital value by the A/D converter in controller 42.

Controller 42 manages battery module 3 based on the voltage, temperature, and current of the plurality of battery cells 10 measured by voltage measurer 41, temperature measurer 43, and current measurer 44. Controller 42 can include a microcomputer and a non-volatile memory (for example, an electrically erasable programmable read-only memory (EEPROM) or a flash memory). SOC-OCV table 42t is held in the non-volatile memory. SOC-OCV table 42t describes the characteristic data of the SOC-OCV curve of battery cell 10.

Controller 42 estimates the SOC of each of the plurality of battery cells 10. Controller 42 estimates the SOC by combining an OCV method and a current integration method. The OCV method is a method of estimating SOC based on the OCV of each battery cell 10 measured by voltage measurer 41 and the characteristic data of the SOC-OCV curve described in SOC-OCV table 42t. The current integration method is a method of estimating SOC based on the OCV at the start of charging-discharging of each battery cell 10 and an integrated value of the current measured by current measurer 44. In the current integration method, a measurement error of current measurer 44 accumulates as the charging-discharging time becomes longer. Therefore, it is necessary to correct the SOC estimated by the current integration method using the SOC estimated by the OCV method.

When using a battery cell using a general graphite negative electrode, a highly accurate OCV could be estimated if electric vehicle 1 stopped for about 30 seconds due to waiting for a traffic signal or the like. On the other hand, when a battery cell having a long polarization elimination time, such as a battery cell using a negative electrode mixed with silicon, is used, a highly accurate OCV cannot be estimated during a temporal stop period of electric vehicle 1, and it becomes difficult to correct the SOC estimated by the current integration method with high accuracy.

Therefore, in the present exemplary embodiment, controller 42 stops inverter 20a after the discharge from battery module 3 to motor 30a completes, and sets a current command value, in DC/DC converter 20b, that instructs the flow of charging current of a preset value for a preset time. DC/DC converter 20b boosts the DC power discharged from auxiliary battery 30b to a voltage equal to or higher than the voltage of the current path, and supplies the boosted DC power to the current path. A charging current having a preset value flows for a preset time from auxiliary battery 30b through the current path to the plurality of battery cells 10 in battery module 3. As a result, it is possible to shorten the time for eliminating the polarization of battery cell 10 after the discharge completes.

Further, in the present exemplary embodiment, controller 42 sets a current command value, in DC/DC converter 20b, that instructs the flow of discharging current of a preset value for a preset time after the charging of battery module 3 from charger 20c completes. DC/DC converter 20b steps down the voltage of the DC power in the current path to a voltage of auxiliary battery 30b and supplies the stepped-down DC power to auxiliary battery 30b. A discharging current having a preset value flows from the plurality of battery cells 10 in battery module 3 to auxiliary battery 30b through the current path for a preset time. As a result, it is possible to shorten the time for eliminating the polarization of battery cell 10 after the charge completes. Note that the discharge current from the plurality of battery cells 10 is not limited to the example of charging auxiliary battery 30b, but may be supplied to auxiliary equipment (an air conditioner, a car navigation system, or the like), which is not shown, of electric vehicle 1. Further, it may be consumed by a heater resistor, which is not shown.

Figure 6:
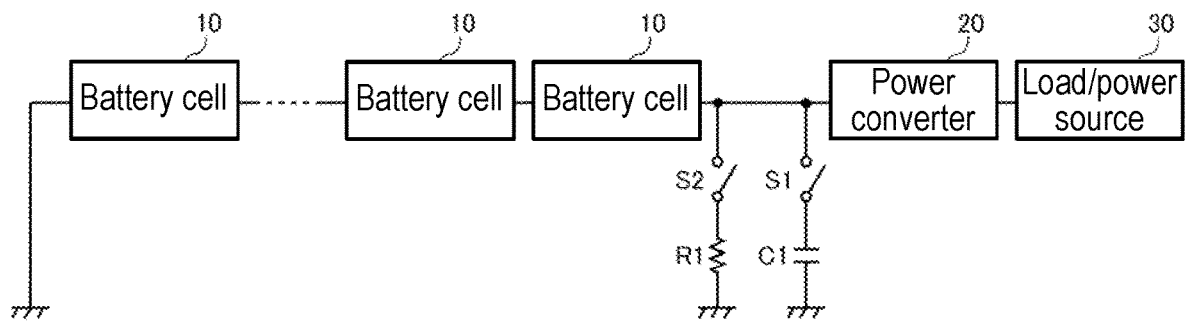
FIG. 6 is a diagram showing Circuit Configuration Example 1 for supplying a reverse current to a battery cell.

FIG. 6 is a diagram showing Circuit Configuration Example 1 for supplying a reverse current to battery cell 10. First switch S1 and first capacitor C1 are connected in series between a DC bus connecting the plurality of battery cells 10 connected in series and power converter 20 and a predetermined fixed potential. For example, a large-capacitance electrolytic capacitor can be used for first capacitor C1. Further, second switch S2 and first resistor R1 are connected in series between the DC bus and the fixed potential. Note that in FIG. 6, management unit 40 is omitted for the sake of simplification.

At the time of discharge of the plurality of battery cells 10, controller 42 sets a current command value or a voltage command value in power converter 20, controls first switch S1 to be in the on state, and controls second switch S2 to be in the off state. Since first switch S1 is in the on state, charges are accumulated in first capacitor C1, and first capacitor C1 acts as a smoothing capacitor for the DC bus.

After the discharge of the plurality of battery cells 10 completes, controller 42 stops the operation of power converter 20 and turns off first switch S1. Then, by turning on first switch S1, the charges accumulated in first capacitor C1 flow to the plurality of battery cells 10 as a charging current. When the preset period elapses, controller 42 turns off first switch S1 and charging of the plurality of battery cells 10 completes.

In this way, first capacitor C1 is charged at the time of the discharge of the plurality of battery cells 10, and after the discharge of the plurality of battery cells 10 completes, a reverse current is applied from first capacitor C1 to the plurality of battery cells 10. Thus, a reverse current can be applied through the plurality of battery cells 10 after the completion of discharging without connecting the plurality of battery cells 10 to another power source such as commercial power system 30c or auxiliary battery 30b. For example, the current path for connecting battery module 3 and auxiliary battery 30b as shown in FIG. 5 becomes unnecessary, and DC/DC converter 20b can also be omitted.

At the time of charge of the plurality of battery cells 10, controller 42 sets a current command value or a voltage command value in power converter 20, controls first switch S1 to be in the on state, and controls second switch S2 to be in the off state. Since first switch S1 is in the on state, charges are accumulated in first capacitor C1, and first capacitor C1 acts as a smoothing capacitor for the DC bus.

After the charge of the plurality of battery cells 10 completes, controller 42 stops the operation of power converter 20, turns off first switch S1, and turns on second switch S2. When second switch S2 is turned on, a current flows from the plurality of battery cells 10 to first resistor R1. When the preset period elapses, controller 42 turns off second switch S2 and discharging from the plurality of battery cells 10 completes.

In Circuit Configuration Example 1 shown in FIG. 6, for example, the capacitor installed on the DC side in the inverter can also be used as first capacitor C1. Further, as first resistor R1, the discharge resistor used in a passive equalizing process of the plurality of battery cells 10 can also be used.

Figure 7A:
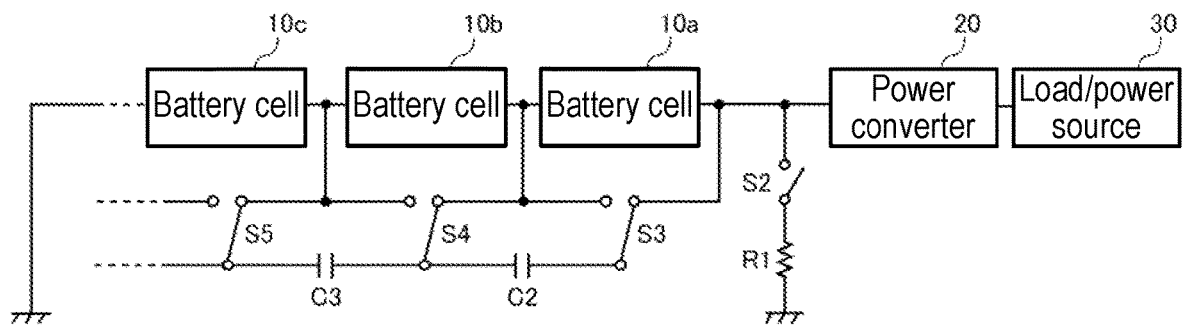
FIGS. 7A to 7B are diagrams showing Circuit Configuration Example 2 for supplying a reverse current to a battery cell.
Figure 7B:
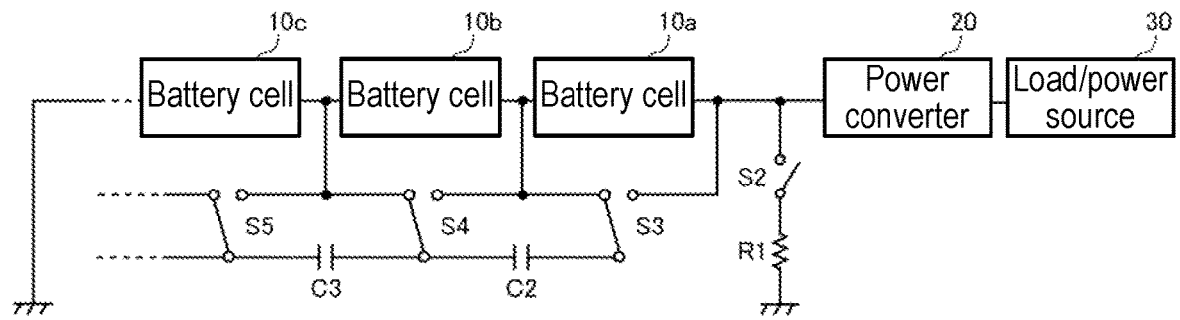

FIGS. 7A to 7B are diagrams showing Circuit Configuration Example 2 for supplying a reverse current to battery cell 10. One terminal of second capacitor C2 can be selectively connected to the positive electrode of an adjacent upper first battery cell 10a or the positive electrode of a lower second battery cell 10b via third switch S3. The other terminal of second capacitor C2 can be selectively connected to the negative electrode of an adjacent upper first battery cell 10a or the negative electrode of a lower second battery cell 10b via fourth switch S4.

One terminal of third capacitor C3 can be selectively connected to the positive electrode of an adjacent upper second battery cell 10b or the positive electrode of a lower third battery cell 10c via fourth switch S4. The other terminal of third capacitor C3 can be selectively connected to the negative electrode of an adjacent upper second battery cell 10b or the negative electrode of a lower third battery cell 10c via fifth switch S5. The configuration below is applied to the lowest battery cell.

At the time of discharge of the plurality of battery cells 10, controller 42 sets a current command value or a voltage command value in power converter 20 as shown in FIG. 7A, and controls third switch S3 to the positive electrode side of first battery cell 10a, fourth switch S4 to the positive electrode side of second battery cell 10b, fifth switch S5 to the positive electrode side of third battery cell 10c, and so on. Second switch S2 is controlled to the off state. In this state, second capacitor C2 is charged by first battery cell 10a, and third capacitor C3 is charged by second battery cell 10b, and so on.

After the completion of charge of the plurality of battery cells 10, controller 42 stops the operation of power converter 20 as shown in FIG. 7B, and controls third switch S3 to the positive electrode side of second battery cell 10b, fourth switch S4 to the positive electrode side of third battery cell 10c, fifth switch S5 to the positive electrode side of a fourth battery cell, which is not shown, and so on. In this state, second battery cell 10b is charged by second capacitor C2, third battery cell 10c is charged by third capacitor C3, and so on. When the preset period elapses, controller 42 turns off third switch S3, fourth switch S4, fifth switch S5, . . . , and charging of the battery cells 10 other than the highest battery cell completes.

In this way, second capacitor C2, third capacitor C3, . . . are charged at the time of discharge of the plurality of battery cells 10, and after the completion of the discharge of the plurality of battery cells 10, discharging is performed from second capacitor C2, third capacitor C3, . . . to battery cells lower than the charged battery cells. Thus, a reverse current can be applied through the plurality of battery cells 10 after the completion of discharging without connecting the plurality of battery cells 10 to another power source such as commercial power system 30c or auxiliary battery 30b.

At the time of charge of the plurality of battery cells 10, controller 42 sets a current command value or a voltage command value in power converter 20, controls third switch S3, fourth switch S4, fifth switch S5, . . . to be in the off state, and also controls second switch S2 to be in the off state.

After the charge of the plurality of battery cells 10 completes, controller 42 stops the operation of power converter 20 and turns on second switch S2. When second switch S2 is turned on, a current flows from the plurality of battery cells 10 to first resistor R1. When the preset period elapses, controller 42 turns off second switch S2 and discharging from the plurality of battery cells 10 completes.

In Circuit Configuration Example 2 shown in FIGS. 7A to 7B, as second capacitor C2, third capacitor C3, . . . , for example, capacitors used in the active equalizing process of the plurality of battery cells 10 can also be used.

Figure 8:
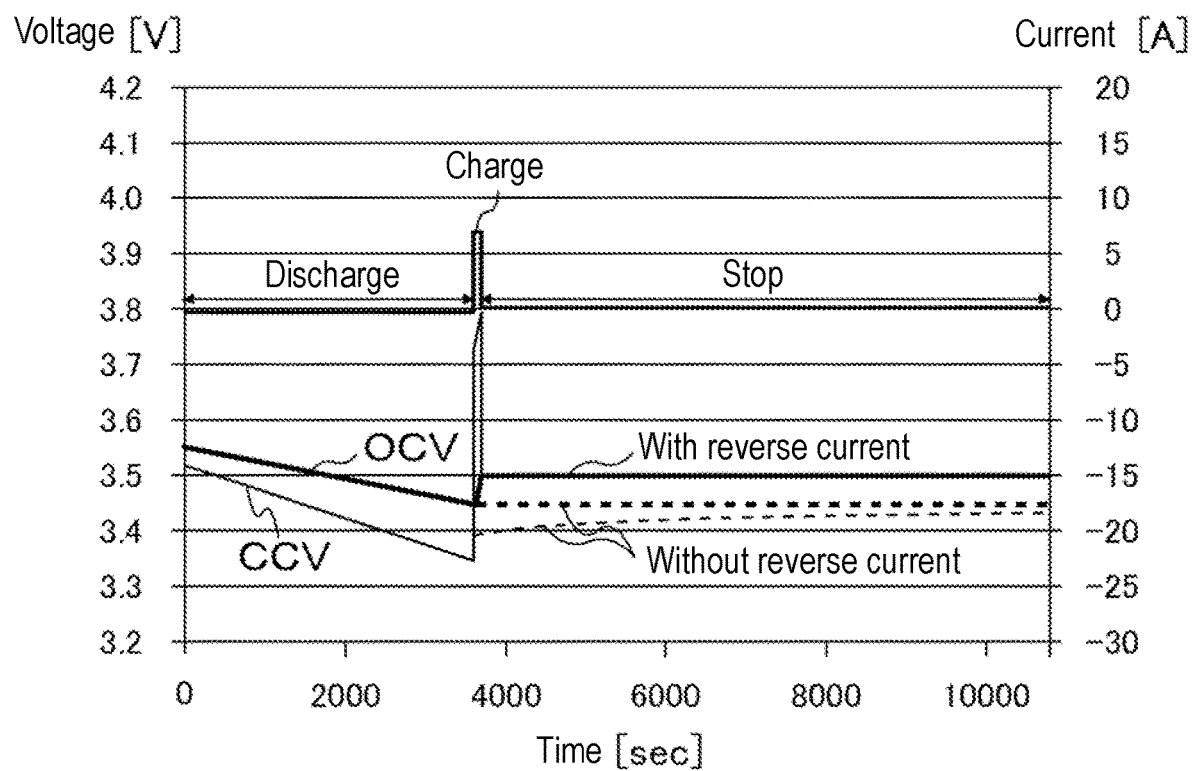
FIG. 8 is a diagram comparing the case where a reverse current is applied and the case where a reverse current is not applied after the completion of discharging.

FIG. 8 is a diagram comparing the case where a reverse current is applied and the case where a reverse current is not applied after the completion of discharging. The thick line shows the time transition of OCV, and the thin line shows the time transition of CCV. When battery cell 10 is discharged at a constant current rate, both OCV and CCV gradually decrease. After the discharge is stopped, a reverse current (charging current) is applied through battery cell 10. In the example shown in FIG. 8, a reverse current of about 7 A is applied for 30 seconds. The time transitions of OCV and CCV when the reverse current is applied are shown by the solid lines, and the time transitions of OCV and CCV when the reverse current is not applied are shown by the dotted lines. When the reverse current is applied, the CCV immediately converges to the OCV. On the other hand, when the reverse current is not applied, the CCV does not converge to the OCV even after several hours have elapsed.

As described above, according to the present exemplary embodiment, by applying the reverse current after the completion of charging-discharging of battery cell 10, a highly accurate OCV can be estimated at an early stage. When OCV can be estimated with high accuracy, SOC can also be estimated with high accuracy. Therefore, highly accurate SOC can be estimated also with battery system 2 mounted on electric vehicle 1 which has a stop period only for a short time.

Further, according to the present exemplary embodiment, the OCV is actually measured instead of estimating the OCV from the equivalent circuit model of battery cell 10, and therefore the estimation accuracy is high. In addition, complicated and enormous calculations for considering temperature dependency and transient characteristics are not required, and memory cost can also be suppressed. Further, according to the present exemplary embodiment, since the OCV is actually measured, it can be applied to various existing algorithms based on the OCV, and can be utilized to improve the performance of the algorithms. Further, in the present exemplary embodiment, no special detection circuit is required. Further, it is possible to divert constituent members such as the equalizing circuit, and in that case the additional cost can be reduced.

Note that the amount of reverse current flowing through battery cell 10 after the completion of charging-discharging of battery cell 10 may be less than the amount that cancels all the charges accumulated in electric double layer capacitance Cdl and diffusion capacitances Cd1 to Cd3 shown in FIG. 1. When the charges accumulated in electric double layer capacitance Cdl and diffusion capacitances Cd1 to Cd3 can be canceled even a little, it will contribute to shortening the polarization elimination time.

The present invention has been described above based on the exemplary embodiment. It is understood by the person of ordinary skill in the art that the exemplary embodiment is an example, various modified examples can be made to the combinations of configuration elements and processing processes, and such modified examples are also within the scope of the present invention.

In the above-described exemplary embodiment, an example in which a preset fixed value is used as the value of the reverse current for canceling the polarization voltage has been described. At this point, the value of the reverse current may be dynamically determined. For example, the current value initially determined based on the voltage change for five seconds after the stop of charging-discharging may be corrected to a preset value. Further, the current value may be newly calculated based on the voltage change for five seconds after the stop of charging-discharging. Further, instead of applying the reverse current continuously for 30 seconds, it may be stopped after flowing for five seconds, and the current value may be corrected if the voltage does not change as expected.

Further, in the circuit configuration examples shown in FIGS. 6 and 7A to 7B, the reverse current is applied through the plurality of battery cells 10 by the electric power accumulated in the capacitor after the completion of the discharge of the plurality of battery cells 10. In this regard, an inductor may be charged at the time of discharge of the plurality of battery cells 10, and the reverse current may be applied from the inductor to the plurality of battery cells 10 after the completion of the discharge of the plurality of battery cells 10. In this case, it is preferable to insert a diode for controlling the direction of the current flowing in the closed loop including the inductor and the plurality of battery cells 10.

Further, in the circuit configuration examples shown in FIGS. 6 and 7A to 7B, the reverse current is applied by applying a current from the plurality of battery cells 10 to first resistor R1 after the completion of the discharge of the plurality of battery cells 10. In this regard, another capacitor may be used instead of first resistor R1. In this case, after the charging of the plurality of battery cells 10 completes, the reverse current can be applied through the plurality of battery cells 10 by turning on second switch S2 to charge the capacitor.

In the above-described exemplary embodiment, an example of applying the present invention to battery system 2 for being mounted on a vehicle has been described, but the present invention can also be applied to a battery system for stationary power storage. Further, the present invention can also be applied to a battery system for electronic devices such as notebook PCs and smartphones.

Note that the exemplary embodiment may be specified by the following items.

[Item 1]
Battery system (2) including:
battery cell (10);
voltage measurer (41) configured to measure a voltage of battery cell (10); and
controller (42) configured to control charging-discharging of battery cell (10),
in which
controller (42) performs control to apply a reverse current for canceling a polarization voltage of battery cell (10) through battery cell (10) after the charging-discharging of battery cell (10) completes.

According to the above, the time for eliminating the polarization can be shortened, and the highly accurate OCV can be estimated at an early stage.

[Item 2]
Battery system (2) according to Item 1, in which
after the charging-discharging of battery cell (10) completes, controller (42) sets a current command value that instructs flow of the reverse current in power converter (20) connected between battery cell (10) and load/power source (30).

The current command value instructing the flow of the reverse current may be a current command value instructing the flow of the reverse current of a preset value to flow for a preset time.

According to the above, the amount of the reverse current flowing through battery cell (10) can be adjusted to an optimum amount.

[Item 3]
Battery system (2) according to Item 1, further including:
capacitor (C1) connected between a DC bus connecting power converter (20) connected between battery cell (10) and load (30) and battery cell (10) and a predetermined fixed potential,
in which
controller (42) charges capacitor (C1) during discharging from battery cell (10) to load (30), and after discharging from battery cell (10) to load (30) completes, applies the reverse current from capacitor (C1) to battery cell (10).

According to the above, the reverse current can be applied through battery cell (10) after the discharge of battery cell (10) completes without connecting another power source such as another battery, system, or generator to battery cell (10).

[Item 4]
Battery system (2) according to Item 1, in which
a plurality of battery cells (10) are provided, and the plurality of battery cells (10) are connected in series,
battery system (2) further includes a plurality of capacitors (C2, C3, . . . ) provided in parallel with the plurality of battery cells (10), and
controller (42) charges the plurality of capacitors (C2, C3, . . . ) during discharging from the plurality of battery cells (10) to load (30) via power converter (20), and after the discharging from the plurality of battery cells (10) to load (30) completes, performs discharging from each of the plurality of capacitors (C2, C3, . . . ) to battery cell (10) lower than battery cell (10) by which the each of the plurality of capacitors (C2, C3, . . . ) is charged.

According to the above, the reverse current can be applied through battery cell (10) after the discharge of battery cell (10) completes without connecting another power source such as another battery, system, or generator to battery cell (10).

[Item 5]
Battery system (2) according to any one of Items 1 to 4, in which controller (42) estimates an OCV (Open Circuit Voltage) of battery cell (10) based on a voltage measured by voltage measurer (41) after the reverse current has finished flowing.

According to the above, the OCV can be estimated with high accuracy from the measured voltage.

[Item 6]
Management device (40) including:
voltage measurer (41) configured to measure a voltage of battery cell (10); and controller (42) configured to control charging and discharging of battery cell (10),
in which
controller (42) performs control to apply a reverse current for canceling a polarization voltage of battery cell (10) through battery cell (10) after the charging and discharging of battery cell (10) is ended.

According to the above, the time for eliminating the polarization can be shortened, and the highly accurate OCV can be estimated at an early stage.

REFERENCE MARKS IN THE DRAWINGS 10 battery cell
Vo open circuit voltage
Rd DC resistor
Vp polarization voltage
Da diffusion in active material
Rr reaction resistor
Cdl electric double layer capacitance
Rd1, Rd2, Rd3 diffusion resistor
Cd1, Cd2, Cd3 diffusion capacitance
20 power converter
30 load/power source
1 electric vehicle
2 battery system
3 battery module
6 charging cable
40 management unit
41 voltage measurer
42 controller
42t SOC-OCV table
43 temperature measurer
44 current measurer
20a inverter
30a motor
20b DC/DC converter
30b auxiliary battery
20c charger
30c commercial power system
RY1, RY2 relay
R1 first resistor
C1-C3 capacitor
S1-S5 switch

The invention claimed is:

1. A battery system comprising:
a battery cell;
a voltage measurer configured to measure a voltage of the battery cell;
a controller configured to control charging-discharging of the battery cell;
a power converter connected between the battery cell and a load;
a DC bus bar connecting the battery cell and the power convertor; and
a capacitor connected between the DC bus and a predetermined fixed potential, wherein:
the controller performs control to apply a reverse current for canceling a polarization voltage of the battery cell through the battery cell after the charging-discharging of the battery cell completes, and
the controller causes the capacitor to be charged during discharging from the battery cell to the load, and after the discharging from the battery cell to the load completes, causes the capacitor to apply the reverse current to the battery.

2. The battery system according to claim 1, wherein after the charging-discharging of the battery cell completes, the controller sets a current command value in the power converter, the current command value instructing the application of the reverse current to the battery cell.

3. A battery system comprising:
a plurality of battery cells connected in series;
a voltage measurer configured to measure a voltage of each of the plurality of battery cells;
a controller configured to control charging-discharging of the plurality of battery cells;
a plurality of capacitors provided in parallel with the plurality of battery cells, wherein:
the controller performs control to apply a reverse current for canceling a polarization voltage of at least one of the plurality of battery cells through the at least one of the plurality of battery cells after the charging-discharging of the plurality of battery cells completes, and
the controller causes the plurality of capacitors to be charged during discharging from the plurality of battery cells to a load via a power converter, and after the discharging from the plurality of battery cells to the load completes, causes each of the plurality of capacitors to discharge to a corresponding one of the plurality of battery cells to charge the plurality of battery cells one by one in an order of higher stages.

4. The battery system according to claim 1, wherein the controller estimates an OCV (Open Circuit Voltage) of each of the battery cell based on a voltage measured by the voltage measurer after the application of the reverse current completes.

5. A management device comprising:
a voltage measurer configured to measure a voltage of a battery cell;
a controller configured to control charging-discharging of the battery cell; and
a capacitor connected between a DC bus and a predetermined fixed potential, the DC bus connecting a power converter and the battery cell, the power converter being between the battery cell and a load,
wherein the controller performs control to apply a reverse current for canceling a polarization voltage of the battery cell through the battery cell after the charging-discharging of the battery cell completes, and
the controller causes the capacitor to be charged during discharging from the battery cell to the load, and after the discharging from the battery cell to the load completes, causes the capacitor to apply the reverse current to the battery.

* * * * *